(12) United States Patent
Chen

(10) Patent No.: US 11,525,852 B2
(45) Date of Patent: Dec. 13, 2022

(54) FIELD PROBE ISOTROPIC COMPENSATION USING ORTHOGONAL SCALAR FIELD COMPONENTS

(71) Applicant: ETS Lindgren Inc., Cedar Park, TX (US)

(72) Inventor: Zhong Chen, Cedar Park, TX (US)

(73) Assignee: ETS-Lindgren, Inc., Cedar Park, TX (US)

( * ) Notice: Subject to any disclaimer, the term of this patent is extended or adjusted under 35 U.S.C. 154(b) by 799 days.

(21) Appl. No.: 16/410,602

(22) Filed: May 13, 2019

(65) Prior Publication Data

US 2019/0346498 A1 Nov. 14, 2019

Related U.S. Application Data

(60) Provisional application No. 62/671,168, filed on May 14, 2018.

(51) Int. Cl.
*G01R 29/08* (2006.01)
*G01R 35/00* (2006.01)

(52) U.S. Cl.
CPC ..... *G01R 29/0892* (2013.01); *G01R 29/0878* (2013.01); *G01R 35/005* (2013.01)

(58) Field of Classification Search
CPC ............ G01R 29/0892; G01R 29/0878; G01R 35/005; G01R 29/08; G01R 31/001
See application file for complete search history.

(56) References Cited

U.S. PATENT DOCUMENTS

2009/0195255 A1* 8/2009 Kalokitis ........... G01R 29/0878
324/522
2018/0123238 A1* 5/2018 Fenn ...................... G01S 3/36

FOREIGN PATENT DOCUMENTS

| EP | 1167984 A1 * | 1/2002 | ............. G01R 29/08 |
| WO | WO-2004049498 A2 * | 6/2004 | ............. G01S 3/74 |
| WO | WO-2018177762 A1 * | 10/2018 | ............. G01D 5/145 |

OTHER PUBLICATIONS

Huan Wang et al: "Compensation method for the coupling error between the EUT and TEM cell in E-field probe isotropic calibration", 2015 IEEE International Symposium on Electromagnetic Compatibility (EMC), IEEE; Aug. 16, 2015 (Aug. 16, 2015), pp. 1195-1200, XP033204129, DOI: 10.1109/1 SEMC.2015.7256339 (Year: 2015).*

(Continued)

*Primary Examiner* — Alexander Satanovsky
*Assistant Examiner* — Asm Fakhruddin
(74) *Attorney, Agent, or Firm* — Christopher & Weisberg, P.A.

(57) ABSTRACT

A method, system and apparatus for compensating for non-ideal isotropic behavior of a field probe are disclosed. A method includes, during a calibration procedure, for each of a plurality of positions of the field probe relative to a source, each position denoted by a set of angles (θ, φ), performing the following steps: measuring a field by the sensors of the probe, storing the measurements and the set of angles (θ, φ) for each measurement, computing a correction factor for the set of angles (θ, φ) based on the measurement, and storing the correction factors. During a measurement procedure, each sensor measures a component of the field. A set of angles is determined based on the sensor measurements, and a correction factor is determined based on the set of angles. The correction factor may then be multiplied by the sensor measurements to obtain the corrected field measurements.

7 Claims, 8 Drawing Sheets

(56) References Cited

OTHER PUBLICATIONS

Pavic et al:" Calculation of Correction Factors to Compensate for the Reference Electric Field Nonuniformity", IEEE Instrumentation and Measurement Technology Conference, Budapest, Hungary, May 21-23, 2001 (Year: 2001).*

IEEE Std 1309-2013, "IEEE Standard for Calibration of Electromagnetic Field Sensors and Probes (Excluding Antennas) from 9 kHz to 40 GHz" (Year: 2013).*

Andre Repjar, "Accurate Determination of Planar Near-Filed Correction Parameters for Linearly Polarized Probes", IEEE Transactions on Antennas and Propagation. Vol 36. No. 6. Jun. 1988 (Year: 1988).*

European Search Report Dated Oct. 14, 2019, issued in EP Application No. 191738855, consisting of 9 pages.

Huan Wang et al: "Compensation method for the coupling error between the EUT and TEM cell in E-field probe isotropic calibration", 2015 IEEE International Symposium On Electromagnetic Compatibility (EMC), IEEE; Aug. 16, 2015 (Aug. 16, 2015), pp. 1195-1200, XP033204129, DOI: 10.1109/1SEMC.2015.7256339 retrieved on Sep. 10, 2015; Consisting of 6-pages.

Narda: "EP-600 series", Mar. 18, 2016 (Mar. 18, 2016), XP055628092, www.narda-sts.it; Retrieved from the Internet: URL:https://www.mdltechnologies.co.uk/wp-content/uploads/2016/03/ EP600.pdf; retrieved on Oct. 2, 2019; Consisting of 2-pages.

Jens Peter K.Arstkarst et al: "Calculable Field Generation Using TEM Cells Applied to the Calibration of a Novel mathstex$E$ /tex/mathsField Probe", IEEE Transactions on Electromagnetic Compatibility, IEEE Service Center, New York, NY, US, vol. 44, No. 1 , I Feb. 2002 (Feb . 1, 2002), XP011019826, ISSN: 00I8-937; Consisting of 13-pages.

Larsen E B et al: "Design and Calibration of the NBS Isotropic Electric-Field Monitor EFM-5Ü, 0.2 to 1 000 Mhz", NBS Technical Note, XX, XX, I Mar. 1981 (Mar. 1, 1981), pages I-VI, 01 , XP008019684; Consisting of 104-pages.

* cited by examiner

FIELD PROBE ISOTROPIC COMPENSATION USING ORTHOGONAL SCALAR FIELD COMPONENTS

FIELD

The present disclosure relates to wireless communications, and in particular, to implementation of field probe isotropic compensation using orthogonal scalar field components.

INTRODUCTION

Isotropic field probes are used widely in electromagnetic field measurements. For example, electric field probes are used in radiated immunity (RI) measurements for electromagnetic compatibility (EMC) testing. A feature of the probes is their isotropic behavior. The field probe should report the same reading regardless of the direction of the incident field. This may be achieved by using three orthogonally oriented dipole or monopole sensing elements or antennas. Some designs use more sensing elements for improved sensing of an incident field from different directions. For example, some designs use six monopole orthogonal sensors in x+, x−, y+, y−, z+ and z− directions. FIG. 1 shows an example of an electric field probe 10 having three orthogonal sensors 12x, 12y and 12z. The probe can be thought of as being situated at the corner of an imaginary cube.

The three orthogonally oriented elements of FIG. 1 are denoted as x, y and z sensors. Each of the sensors is linearly polarized, and measures the electric field parallel to the sensor polarization direction. The total electric field is calculated by:

$$E_{total} = \sqrt{E_x^2 + E_y^2 + E_z^2} \quad (1)$$

where $E_{total}$ is the total electric field measured by the probe. $E_x$, $E_y$, $E_z$ are the electric field for x, y and z polarizations, respectively. For electrically small dipole and monopole sensor elements, each of the antenna patterns is similar to that of a point dipole. In such a case, the field probe is isotropic, i.e., the total electric field $E_{total}$ measured by the probe is the same regardless of the incident field directions. This can be illustrated by the example shown below.

Assume an incident plane wave with the E field polarized in the x direction. As the probe rotates from 0 degrees to 360 degrees about the x-axis, the electric field reading from the three sensors is recorded.

The responses from the three sensors as a function of the rotation angle are shown in FIG. 2. The total electric field when summed using Eq. (1) is constant as shown by the horizontal line at the value 1 on the vertical axis. It is evident that the summed response of the probe is not a function of the orientation of the probe with respect to the direction of the incident field. Even though the description above uses an x-oriented incident field for illustration, the field orientation is not limited. It can be shown that the probe response is isotropic even when the incident field direction is arbitrary. This is valid when each of the sensors possesses a radiation pattern similar to a point dipole.

The field probes may be designed to be broadband devices. For example, the field probe shown in FIG. 1 may have a specified frequency range from 100 KHz to 6 GHz. At higher frequencies, for example, at greater than 3 GHz for such a probe, the sensors 12x, 12y and 12z become electrically large, and the radiation patterns of the sensors deviate from that of a point dipole. As a result, the isotropic response of the probe deteriorates. In some cases, several dB of variations from the ideal isotropic behavior can be seen.

FIG. 3 shows an example of a probe rotational response about the orthogonal angle where each sensor has higher gain than a point dipole. This is typical of a probe at the higher end of the frequency range of operation of the probe. It is seen that the probe is no longer perfectly isotropic resulting in substantial fluctuation of the total electric field as a function of angle.

BRIEF DESCRIPTION OF THE DRAWINGS

A more complete understanding of the present embodiments, and the attendant advantages and features thereof, will be more readily understood by reference to the following detailed description when considered in conjunction with the accompanying drawings wherein.

DETAILED DESCRIPTION

Figure 1:
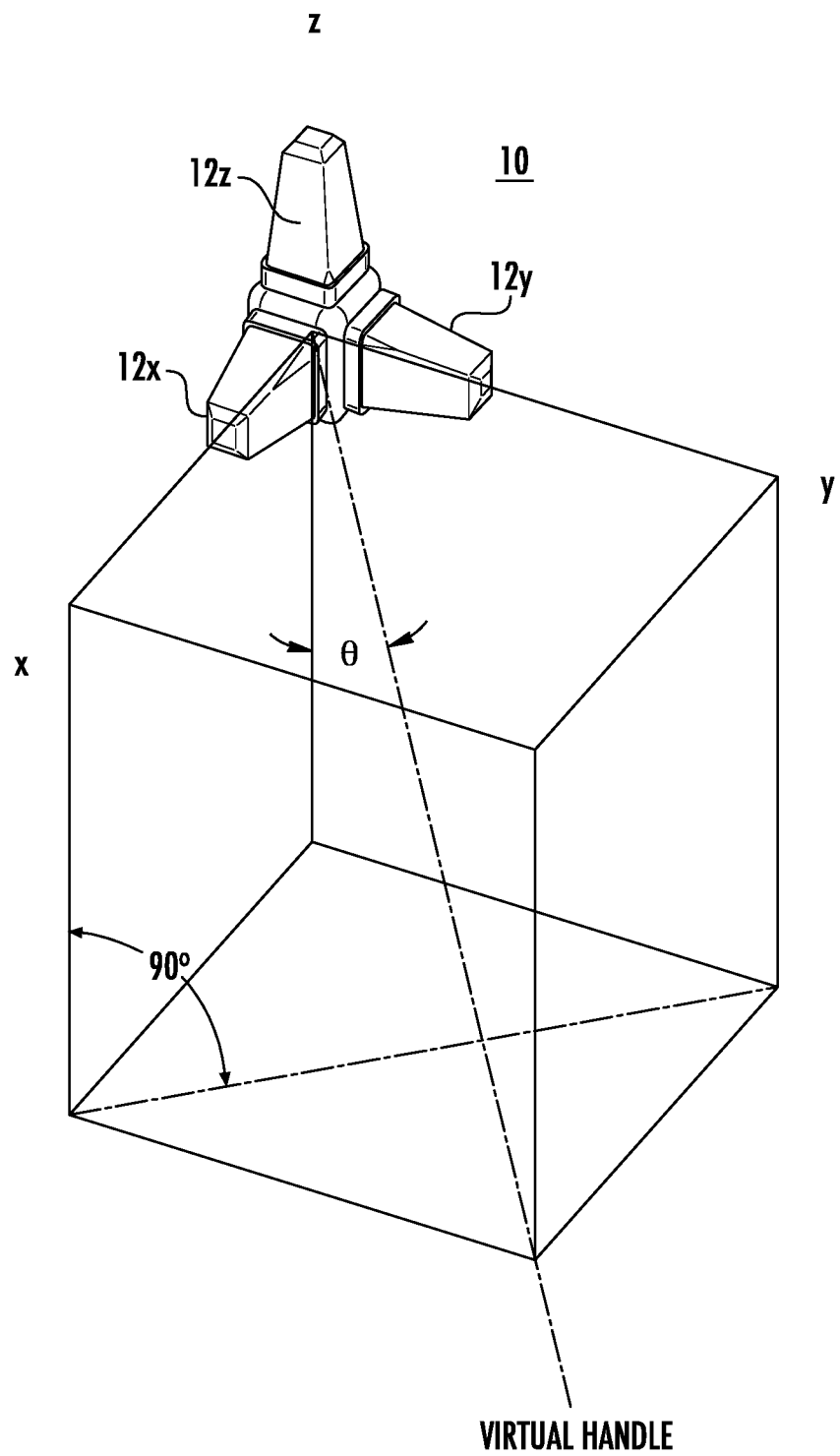
FIG. 1 illustrates an orientation of a 3-axis field probe having three sensors.
Figure 2:
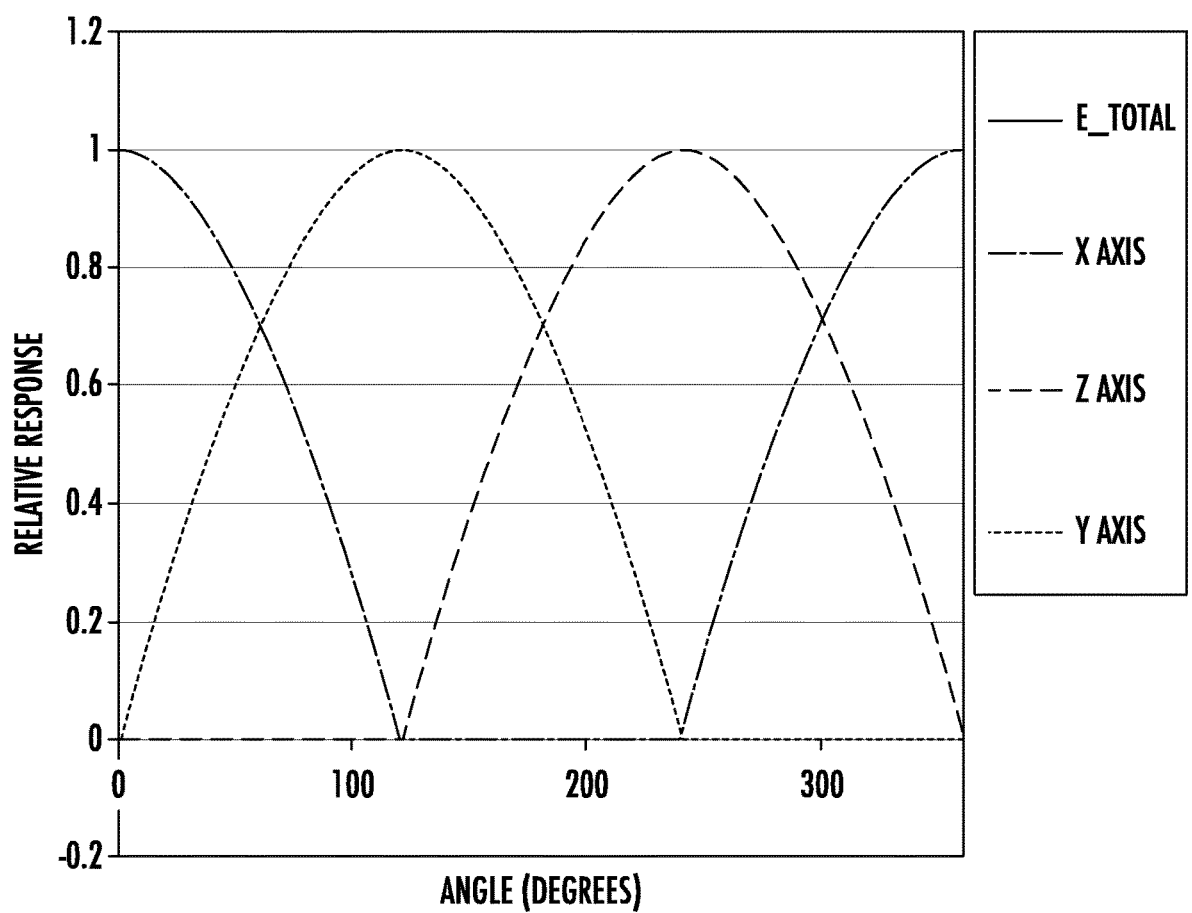
FIG. 2 shows responses from the three sensors as a function of the rotation angle.

Before describing in detail exemplary embodiments, it is noted that the embodiments reside primarily in combinations of apparatus components and processing steps related to implementation of field probe isotropic compensation using measured scalar field components. Accordingly, components have been represented where appropriate by conventional symbols in the drawings, showing only those specific details that are pertinent to understanding the embodiments so as not to obscure the disclosure with details that will be readily apparent to those of ordinary skill in the art having the benefit of the description herein. Like numbers refer to like elements throughout the description.

As used herein, relational terms, such as "first" and "second," "top" and "bottom," and the like, may be used solely to distinguish one entity or element from another entity or element without necessarily requiring or implying any physical or logical relationship or order between such entities or elements. The terminology used herein is for the purpose of describing particular embodiments only and is not intended to be limiting of the concepts described herein. As used herein, the singular forms "a", "an" and "the" are intended to include the plural forms as well, unless the context clearly indicates otherwise. It will be further understood that the terms "comprises," "comprising," "includes"

and/or "including" when used herein, specify the presence of stated features, integers, steps, operations, elements, and/or components, but do not preclude the presence or addition of one or more other features, integers, steps, operations, elements, components, and/or groups thereof.

In embodiments described herein, the joining term, "in communication with" and the like, may be used to indicate electrical or data communication, which may be accomplished by physical contact, induction, electromagnetic radiation, radio signaling, infrared signaling or optical signaling, for example. One having ordinary skill in the art will appreciate that multiple components may interoperate and modifications and variations are possible of achieving the electrical and data communication.

In some embodiments described herein, the term "coupled," "connected," and the like, may be used herein to indicate a connection, although not necessarily directly, and may include wired and/or wireless connections.

Figure 3:
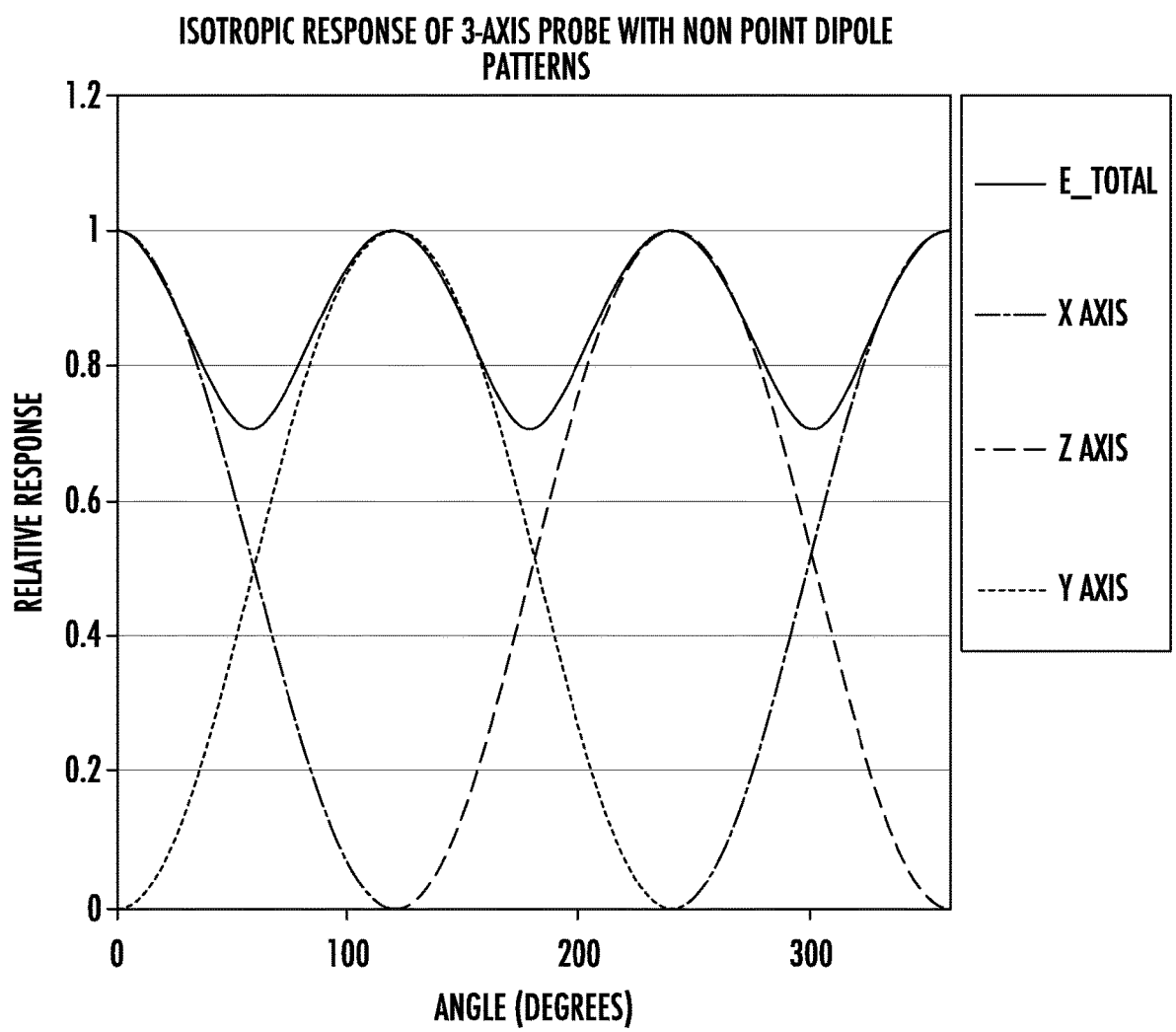
FIG. 3 shows an example of a probe rotational response about the orthogonal angle where each sensor has higher gain than a point dipole.

Some embodiments provide a post processing algorithm as described herein to compensate for the non-ideal isotropic behavior of the probes. For example, for the probe having a response as shown in FIG. 3, assume the probe is placed in a field with an unknown incident direction. Suppose, for example, that the probe reading (Ex, Ey, Ez) is (0.5, 0.5, 0) after normalizing to the maximum reading. From FIG. 3, for the probe to read with the same amplitude in the x, y, and z directions, the incident field angle should be 60 degrees. It is then possible to estimate the angle of incidence. Once the angle of incidence is known, the probe response as a function of angle can be corrected.

In a 3-dimensional sense, probe pattern corrections work similarly. The 3D radiation patterns of the probe may be characterized first. For example, this can be measured during the calibration or design of the probe by rotating the probe in three dimensions, for example using a $(\theta, \phi)$ positioner. A 3D map may then be established for Ex, Ey and Ez at any incident angle, i.e., for each $(\theta, \phi)$ pair, there is a corresponding (Ex, Ey, Ez) reading by the probe, or in the case of six orthogonal sensors, a corresponding (Ex+, Ex−, Ey+, Ey−, Ez+, Ez−) reading. In some embodiments, the six orthogonal sensors may be grouped by orthogonal pairs of sensors, each sensor in a pair being opposite in direction so that, for example, a first pair of sensors measure Ex+ and Ex− and are 180 degrees apart, a second pair of sensors measure Ey+ and Ey− and are 180 degrees apart, and a third pair of sensors measure Ez+ and Ez− and are 180 degrees apart. In some embodiments, the average value of Ex+ and Ex−, for example, measured at a point may be taken as the value of Ex at the point. In some embodiments, the maximum of Ex+ and Ex−, for example, may be taken as the value of Ex at the point. The same holds true for Ey and Ez. Results can be extended to other probes having sensors in fewer than or more than three or six dimensions.

This data may then be used in a lookup table when the probe is immersed in a wave with unknown orientation to determine the direction of the field. A correction factor can be computed for each incident direction $(\theta, \phi)$. In other words, the correction factor k may be calculated as $$k(\theta, \phi) = \frac{E_{inc}}{\sqrt{E_x(\theta, \phi)^2 + E_y(\theta, \phi)^2 + E_z(\theta, \phi)^2}} \quad (2)$$

where k is the isotropic correction factor for incident field angle $(\theta, \phi)$, and $E_{inc}$ is the known magnitude of the applied field when measuring the 3D pattern.

When a measurement is done using the probe, the probe reading may first be normalized, e.g., $(E_x/\sqrt{E_x^2+E_y^2+E_z^2}, E_y/\sqrt{E_x^2+E_y^2+E_z^2}, E_z/\sqrt{E_x^2+E_y^2+E_z^2})$. This normalized reading may then be used to find the set of angles corresponding to this reading from the table of angles. There could be multiple angle pairs $(\theta, \phi)$ which can potentially match the probe reading. This is not of concern for isotropic compensation purposes for they may have the same correction factor $k(\theta, \phi)$.

From the probe readings of the 3-axes E field information, it is possible to estimate the angle of arrival of the incident field. An algorithm may be used to estimate the angle. In some embodiments, the estimated angle is the angle in a table that corresponds to the measured E field information. Correction factors for an isotropic response can be applied from a previously characterized 3D probe pattern. The correction factor to be applied is a correction factor that corresponds to the estimated angle and is stored in the table. Once the correction factor is obtained for the estimated angle, the measured E field information may be multiplied by the correction factor to correct for the anisotropy of the field probe.

Thus, even when the underlying probe response is not entirely isotropic, full isotropy may be achieved with some of the methods set forth herein.

Figure 4:
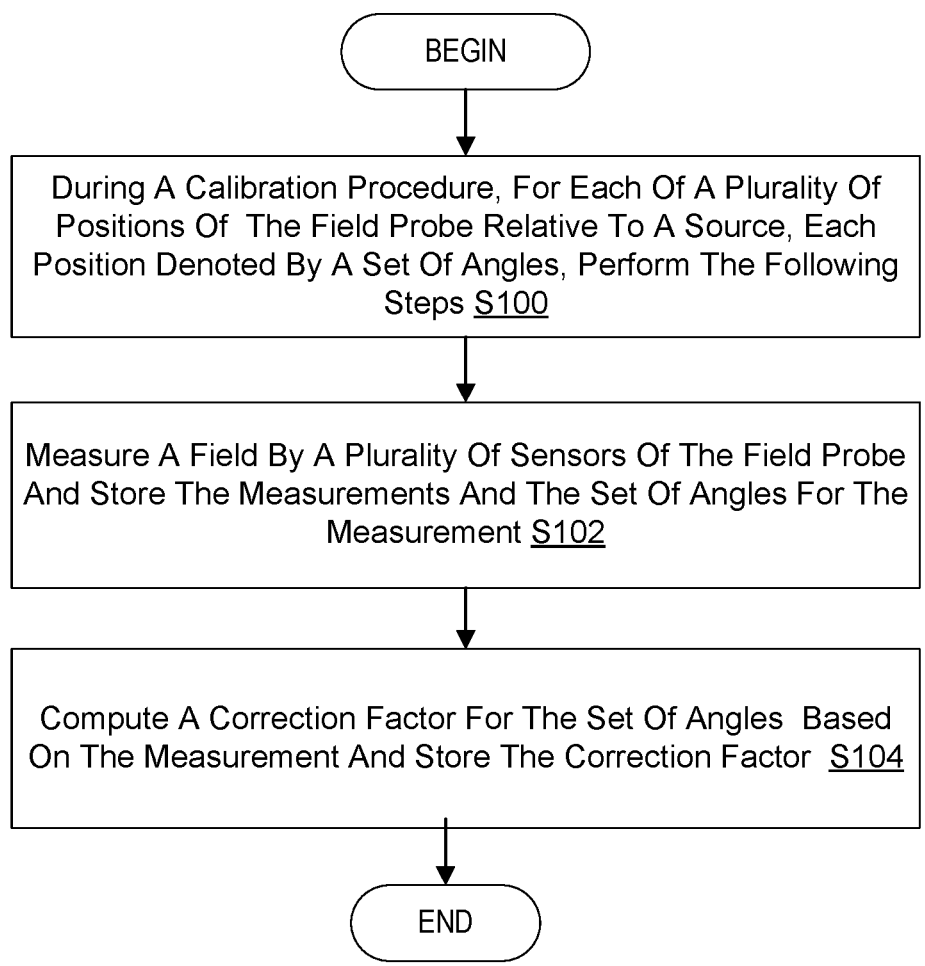
FIG. 4 is a flowchart of an exemplary process during a calibration procedure for measuring and storing field measurements, angles and correction factors for a field probe.

FIG. 4 is a flowchart of an exemplary process for compensating for non-ideal isotropic behavior of a field probe. The process includes, during a calibration procedure, for each of a plurality of positions of the field probe relative to a source, each position denoted by a set of angles, performing the following steps (Block S100): measuring a field by a plurality of sensors of the field probe and store the measurement and the set of angles for the measurement (Block S102); and computing a correction factor for the set of angles based on the measurement and store the correction factor (Block S104).

Ideally, suppose the probe should measures, after normalization, 1.0 on the x-axis sensor, zero on the y-axis sensor and zero on the z-axis sensor. Suppose the actual measurement is (0.8, 0.2, 0.3). Then the correction factor should be $k(\theta, \phi)=1.1396$, and this correction factor would be stored for the angle (0, 0).

The process further includes, for each position of the probe, storing the field probe readings, the angles and the correction factor for each set of angles (block S104).

Figure 5:
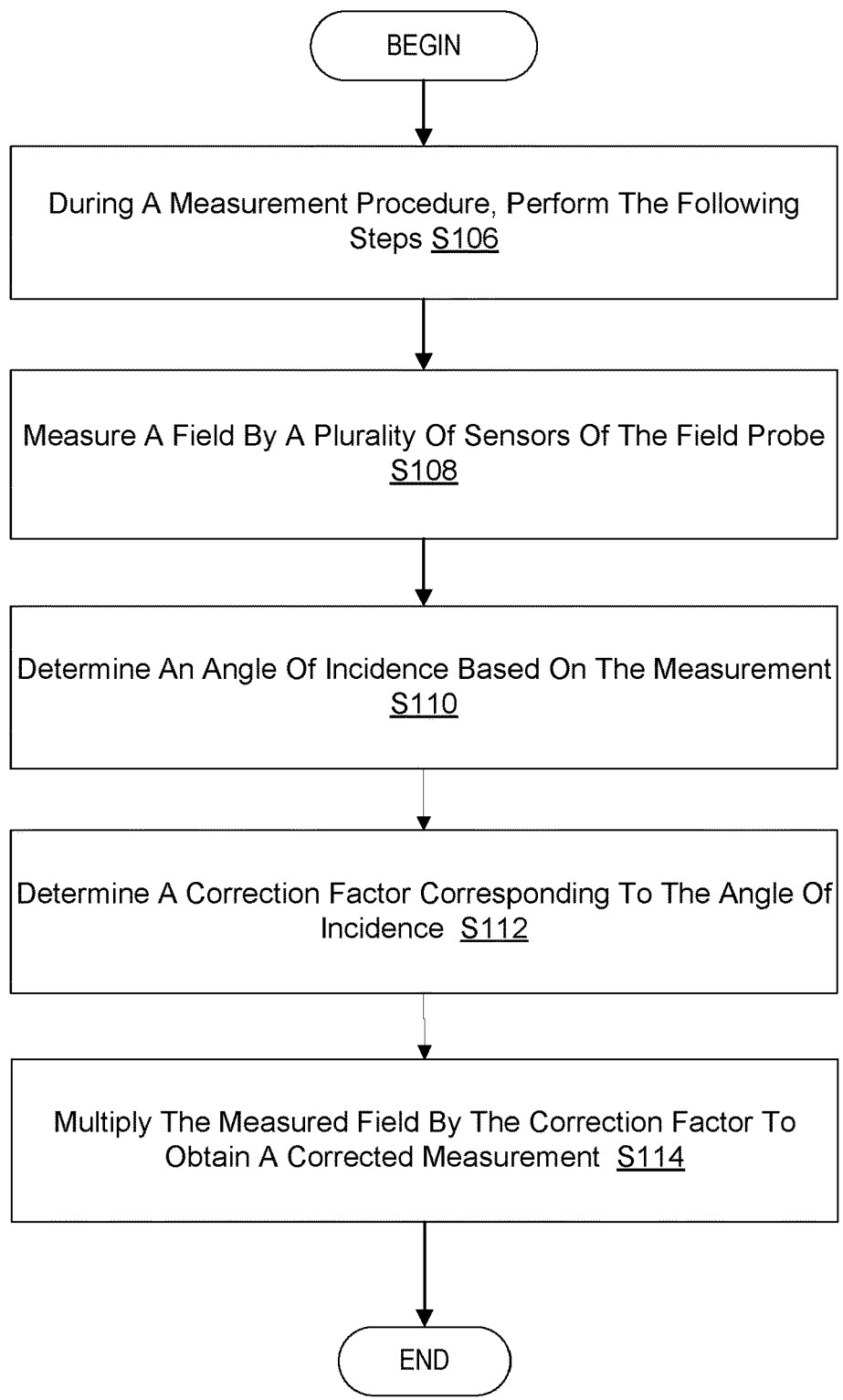
FIG. 5 is a flowchart of an exemplary process during a measurement procedure for correcting a measured field by a correction factor.

FIG. 5 is a flowchart of an exemplary process for compensating for non-ideal isotropic behavior of a field probe is provided. The process includes, during a measurement procedure (Block S106), measuring a field by a plurality of sensors of the field probe (Block S108). The process also includes using the measurement to determine an angle of incidence (Block S110). The process also includes determining a correction factor corresponding to the angle of incidence (Block S112). The process also includes multiplying the measured field by the correction factor to obtain a corrected measurement (Block S114). Suppose that the x, y and z measurements are (0.8, 0.2, 0.3) and suppose that the magnitude of the incident field is 1. This ordered triplet is looked up in the table and the angle (0, 0) is retrieved. For this angle, the correction factor $k(\theta, \phi)$ equal to 1.1396 is retrieved and this correction factor is are multiplied by the measurements Ex, Ey and Ez to achieve a corrected field Ex, Ey, and Ez.

Figure 6:
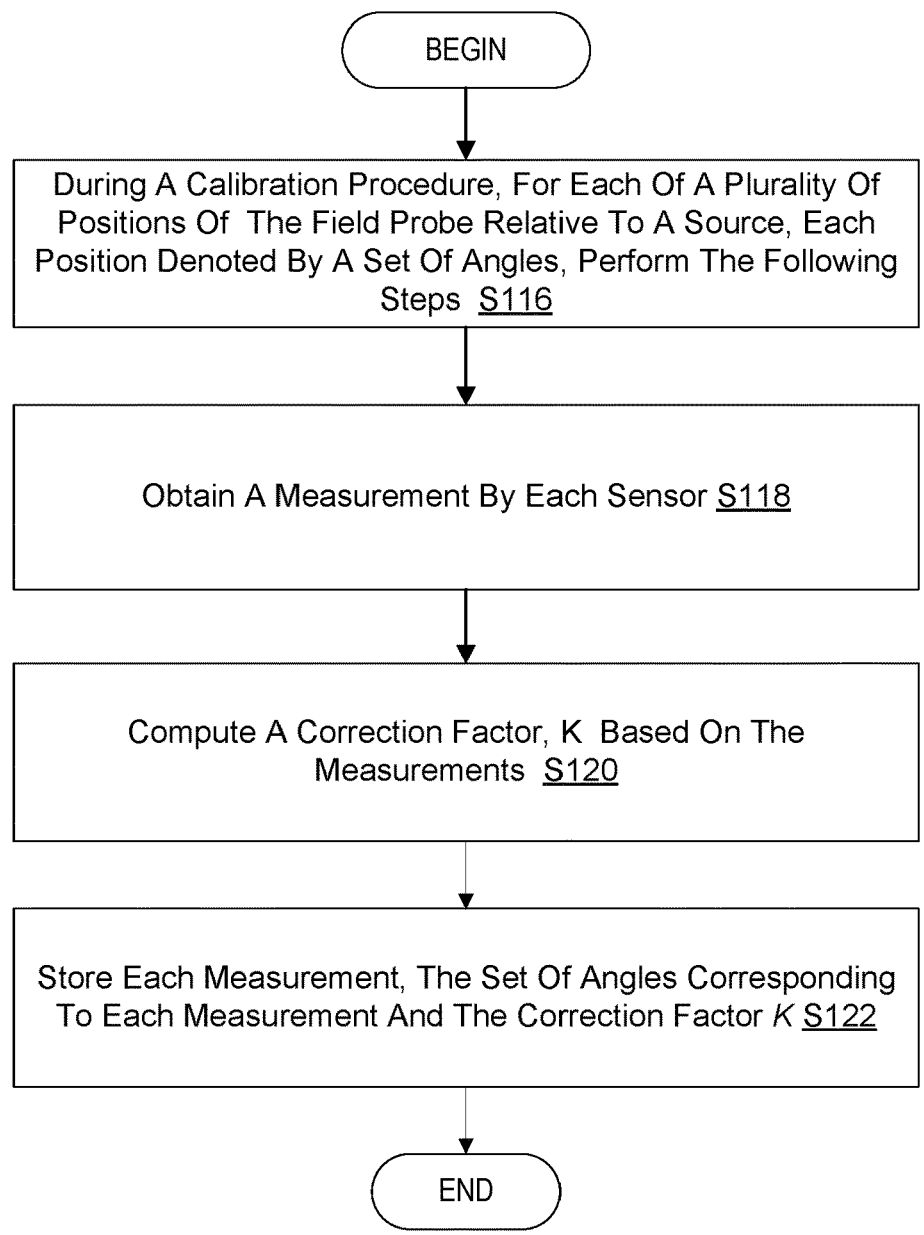
FIG. 6 is a flowchart of an exemplary process during a calibration procedure for measuring and storing field measurements, angles and correction factors for a field probe.

FIG. 6 is a flowchart of an exemplary process for compensating for non-ideal isotropic behavior of a field probe having at least three orthogonal sensors. The process includes during a calibration procedure, for each of a plurality of positions of the field probe relative to a source, each position denoted by a set of angles, performing the following steps (Block S116). The process includes obtaining a measurement by each sensor (Block S118). The process also includes computing a correction factor, k for each set of angles based on the measurements (Block S120). The process further includes storing each measurement, storing the set of angles corresponding to the measurements and storing the correction factor k for the set of angles (Block S122).

Figure 7:
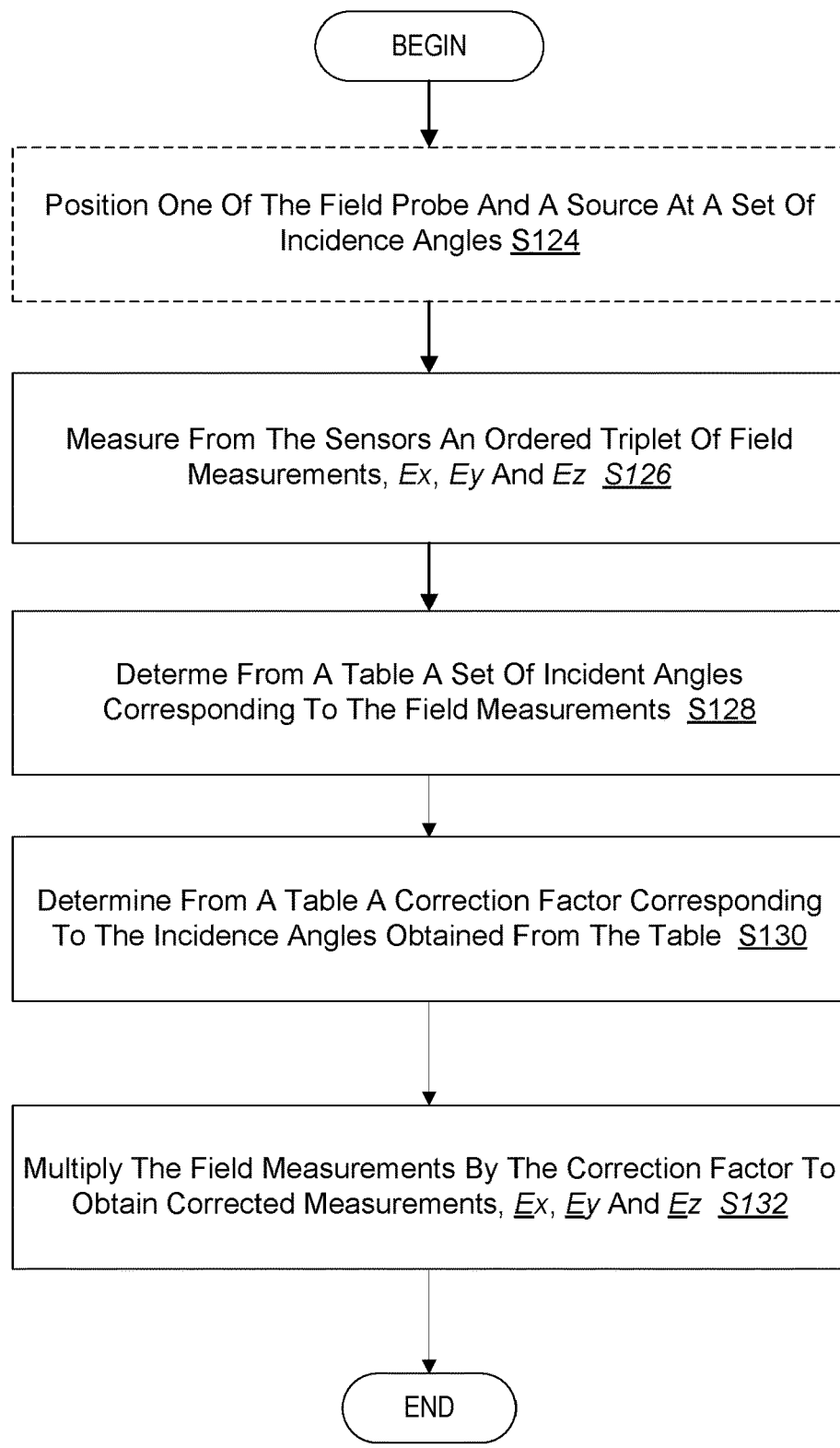
FIG. 7 is a flowchart of an exemplary process during a measurement procedure for correcting a measured field by a correction factor.

FIG. 7 is a flowchart of an exemplary process for compensating for non-ideal isotropic behavior of field probe, the field probe having three orthogonal sensors. The method includes, during a measurement procedure, optionally positioning one of the field probe and a source at a set of incidence angles (θ, φ) (Block S124); measuring from the sensors an ordered triplet of field measurements, Ex(θ, φ), Ey(θ, φ) and Ez(θ, φ) (Block S126); determining from a table a set of incident angles (θ', φ') corresponding to the field measurements (Block S128); determining from a table a correction factor corresponding to the incident angles (θ', φ') (Block S130); and multiplying the field measurements by the correction factor to obtain corrected measurements, $\underline{E}x(θ, φ)$, $\underline{E}y(θ, φ)$ and $\underline{E}z(θ, φ)$ (Block S132).

Thus, some embodiments include a method for compensating for non-ideal isotropic behavior of a field probe. The method includes, during a calibration procedure, for each of a plurality of positions of the field probe relative to a source, each position denoted by a set of angles (θ, φ), performing the following steps: measuring a field by a plurality of sensors of the field probe, storing the measurements by the sensors and the set of angles (θ, φ), computing a correction factor for the set of angles (θ, φ) based on the measurements, and storing the correction factor. Thus, in some embodiments, during the calibration, a known field may be applied and a set of corrections may be computed and stored. During measurement, from the probe readings, one can look up and find the angle pair. Corrections can then be applied for that angle direction.

According to this aspect, in some embodiments, the field probe comprises three orthogonally-directed sensors and a measurement is made by each sensor for each set of angles (θ, φ). In some embodiments, the correction factor is given by:

$$k(θ, φ) = \frac{E_{inc}}{\sqrt{E_x(θ, φ)^2 + E_y(θ, φ)^2 + E_z(θ, φ)^2}},$$

where k is the correction factor for the set of angles (θ, φ), Ex, Ey and Ez are the fields measured by the three sensors as expressed in an x-y-z coordinate system, respectively, and $E_{inc}$ is a magnitude of an applied known field. In some embodiments, the fields Ex, Ey and Ez are normalized prior to storing the measurement according to: $(E_x/\sqrt{E_x^2+E_y^2+E_z^2}$, $E_y/\sqrt{E_x^2+E_y^2+E_z^2}$, $E_z/\sqrt{E_x^2+E_y^2+E_z^2})$, respectively. In some embodiments, the field probe comprises six orthogonally-directed sensors and a measurement is made by each sensor for each set of angles (θ, φ). In some embodiments, the field probe has a plurality of sensors and measuring the field by the field probe includes measuring by each sensor a field value that is mapped to three orthogonal directions. According to another aspect, a method for compensating for non-ideal isotropic behavior of a field probe is provided. The method includes, during a measurement procedure, measuring a field by a plurality of sensors of the field probe, determining an angle of incidence based on the measurement, determining a correction factor corresponding to the angle of incidence, and multiplying the measured field by the correction factor to obtain a corrected measurement.

According to this aspect, in some embodiments, the measured field is normalized prior to determining the angle of incidence. In some embodiments, the angle of incidence is determined from a table that maps measurements to angles. In some embodiments, the correction factor is determined from a table that maps angles to correction factors. In some embodiments, the correction factor is determined from a table that maps measurements to correction factors.

Figure 8:
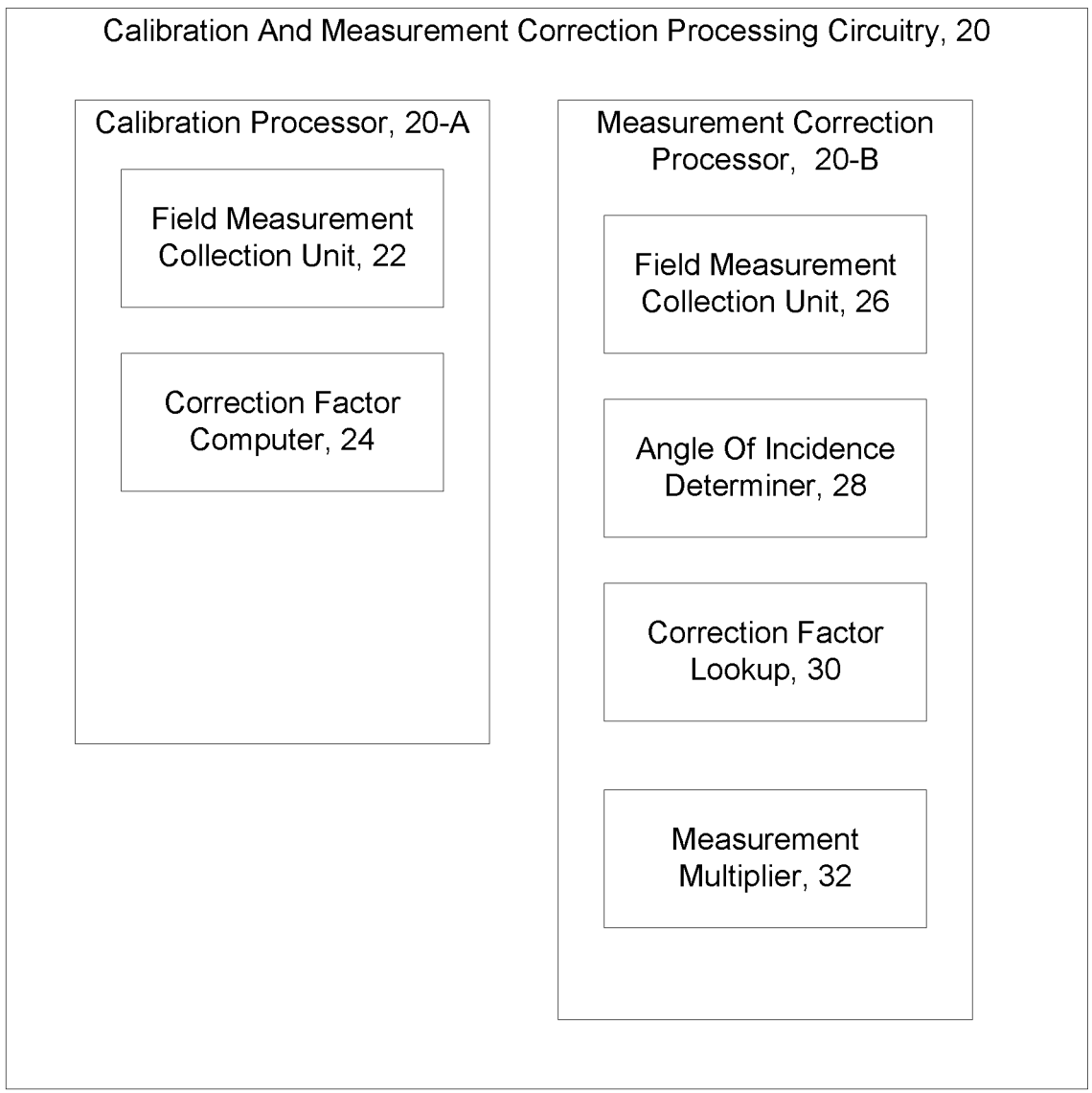
FIG. 8 is a block diagram of calibration and measurement correction processing circuitry according to principles set forth herein.

According to yet another aspect, FIG. 8 is a block diagram of a calibration and measurement correction processing circuitry 20, such as configured to calibrate and store measurements and correction factors for compensating for non-ideal isotropic behavior of a field probe is provided. The apparatus includes, during a calibration procedure, a calibration processor 20-A which, for each of a plurality of positions of the field probe relative to a source, each position denoted by a set of angles (θ, φ): obtains a measurement by each sensor via the field measurement collection unit 22; computing a correction factor, k(θ, φ) based on the measurements via a correction factor computer 24; and storing via the field measurement collection unit 22 the measurements of the sensors, the set of angles corresponding to the measurement of the sensors and the correction factor k(θ, φ).

According to this aspect, in some embodiments, the correction factor is given by:

$$k(θ, φ) = \frac{E_{inc}}{\sqrt{E_x(θ, φ)^2 + E_y(θ, φ)^2 + E_z(θ, φ)^2}}$$

wherein Ex(θ, φ), Ey(θ, φ) and Ez(θ, φ) are the field measurements derived from the sensor measurements at each position and set of angles (θ, φ). In some embodiments, the measured fields Ex(θ, φ), Ey(θ, φ) and Ez(θ, φ) are normalized according to: $(E_x/\sqrt{E_x^2+E_y^2+E_z^2}$, $E_y/\sqrt{E_x^2+E_y^2+E_z^2}$, $E_z/\sqrt{E_x^2+E_y^2+E_z^2})$, respectively.

According to another aspect, an apparatus to generate corrected measurements from a field probe, the apparatus including processing circuitry 20 configured to compensate for non-ideal isotropic behavior of the field probe, the field probe having three orthogonal sensors. The processing circuitry 20 is configured to, during a measurement procedure: collect a set of measurements by the field probe via the field measurement collection unit 26. determine, via the field measurement collection unit 26, from measurements by the sensors, an ordered triplet of field measurements, Ex(θ, φ), Ey(θ, φ) and Ez(θ, φ); determine, via an angle of incidence determiner 28, from a table a set of incident angles (θ', φ') corresponding to the field measurements; determine via a correction factor look up unit 30, which looks up a correction factor from a table at a memory location corresponding to the incident angles (θ', φ'); and multiply, via the measurement multiplier 32, the field measurements by the correction factor to obtain corrected measurements, $\underline{E}x(θ, φ)$, $\underline{E}y(θ, φ)$ and $\underline{E}z(θ, φ)$.

According to this aspect, in some embodiments, the field measurements are normalized prior to determining the incident angles. In some embodiments, the incident angles are determined from a table that maps measurements to angles. In some embodiments, the correction factor is determined from a table that maps angles to correction factors.

It will be understood that the processing circuitry 20 can be implemented as a computer processor and memory for computing and storing correction factors and corrected measurements. Alternatively, processing circuitry 20 can be implemented as application specific circuitry or a combination of application specific circuitry and the computer processor and memory.

It will be understood that storing the measurement and the angles associated with that measurement may be accomplished by storing the measurement in an addressable, searchable memory such that the memory may be searched for angles that correspond to a measurement. It will also be understood that storing the correction factors may be accomplished by storing the correction factors in an addressable searchable memory such that the memory may be addressed to retrieve a correction factor corresponding to a set of angles. The steps of any of the methods set forth herein may be performed by a processor in communication with such memory, the processor being application specific circuitry or a programmable processor operating according to computer instructions to cause the processor to perform the steps of such method. It will further be understood that although a probe may have three orthogonal sensors and corrections may be determined for a pair of angles defining a three dimensional space, the methods set forth herein may be applied to a probe having two orthogonal sensors and corrections may be determined for a pair of angles where one of the angles is fixed, defining a two dimensional space. It will be further understood that a probe may have greater than three orthogonal sensors and corrections may be determined for a pair of angles defining a three dimensional space.

Thus, a method, system and apparatus for compensating for non-ideal isotropic behavior of a field probe are disclosed. A method includes, during a calibration procedure, for each of a plurality of positions of the field probe relative to a source, each position denoted by a set of angles ($\theta$, $\phi$), performing the following steps: measuring a field by the sensors of the probe, storing the measurements and the set of angles ($\theta$, $\phi$) for each measurement, computing a correction factor for the set of angles ($\theta$, $\phi$) based on the measurement, and storing the correction factors. During a measurement procedure, each sensor measures a component of the field. A set of angles is determined based on the sensor measurements, and a correction factor is determined based on the set of angles. The correction factor may then be multiplied by the sensor measurements to obtain the corrected field measurements.

Some embodiments include:

Embodiment A1

A method for compensating for non-ideal isotropic behavior of a field probe, the method comprising:
during a calibration procedure:
rotating the field probe to a plurality of angles, and for each angle, recording a reading of the field probe;
computing a correction factor for each angle based on the reading for the angle; and storing the field probe readings, the angles and the correction factors.

Embodiment A2

The method of Embodiment A1, wherein the field probe comprises three orthogonally-directed probes and a field component reading for each direction of orientation is recorded and stored for each angle.

Embodiment A3

The method of Embodiment A2, wherein the correction factor is given by:

$$k(\theta, \phi) = \frac{E_{inc}}{\sqrt{E_x(\theta, \phi)^2 + E_y(\theta, \phi)^2 + E_z(\theta, \phi)^2}}$$

where k is the correction factor for incident field angle ($\theta$, $\phi$), and $E_{inc}$ is a magnitude of an applied field.

Embodiment B1

A method for compensating for non-ideal isotropic behavior of a field probe, the method comprising:
during a measurement procedure:
measuring a field by the field probe;
using the measurement of the field to determine an angle of incidence;
determining a correction factor corresponding to the angle of incidence;
multiplying the measured field by the correction factor to obtain a corrected measurement.

Embodiment B2

The method of Embodiment B1, wherein the measured field is normalized prior to determining the angle of incidence.

Embodiment B3

The method of Embodiment B1, wherein the angle of incidence is determined from a table that maps measurements to angles.

Embodiment B4

The method of Embodiment B1, wherein the correction factor is determined from a table that maps angles to correction factors.

As will be appreciated by one of skill in the art, the concepts described herein may be embodied as a method, data processing system, computer program product and/or computer storage media storing an executable computer program. Accordingly, the concepts described herein may take the form of an entirely hardware embodiment, an entirely software embodiment or an embodiment combining software and hardware aspects all generally referred to herein as a "circuit" or "module." Any process, step, action and/or functionality described herein may be performed by, and/or associated to, a corresponding module, which may be implemented in software and/or firmware and/or hardware. Furthermore, the disclosure may take the form of a computer program product on a tangible computer usable storage medium having computer program code embodied in the medium that can be executed by a computer. Any suitable tangible computer readable medium may be utilized including hard disks, CD-ROMs, electronic storage devices, optical storage devices, or magnetic storage devices.

Some embodiments are described herein with reference to flowchart illustrations and/or block diagrams of methods, systems and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer (to thereby create a special purpose computer), special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable memory or storage medium that can direct a computer or other programmable data processing apparatus to function in a particular manner, such that the instructions stored in the computer readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Computer program code for carrying out operations of the concepts described herein may be written in an object oriented programming language such as Java® or C++. However, the computer program code for carrying out operations of the disclosure may also be written in conventional procedural programming languages, such as the "C" programming language. The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

It will be appreciated by persons skilled in the art that the embodiments described herein are not limited to what has been particularly shown and described herein above. In addition, unless mention was made above to the contrary, it should be noted that all of the accompanying drawings are not to scale. A variety of modifications and variations are possible in light of the above teachings without departing from the scope of the following claims.

The invention claimed is:

1. A method for compensating for anisotropic behavior of a field probe, the method comprising:
during a calibration procedure, for each of a plurality of positions of the field probe relative to a source, each position denoted by a set of angles ($\theta$, $\phi$);
measuring a field by a plurality of sensors of the field probe;
storing the measurements by the sensors and the set of angles ($\theta$, $\phi$);
computing a correction factor k($\theta$, $\phi$) for the set of angles ($\theta$, $\phi$) based on the measurements, the correction factor being given by:

$$k(\theta, \phi) = \frac{E_{inc}}{\sqrt{E_x(\theta, \phi)^2 + E_y(\theta, \phi)^2 + E_z(\theta, \phi)^2}}$$

Ex, Ey and Ez are the fields measured by the three sensors as expressed in an x-y-z coordinate system, respectively, and $E_{inc}$ is a magnitude of an applied known field; and
storing the correction factor.

2. The method of claim 1, wherein the field probe comprises three orthogonally-directed sensors and a measurement is made by each sensor for each set of angles ($\theta$, $\phi$).

3. The method of claim 1, wherein the fields Ex, Ey and Ez are normalized prior to storing the measurement according to:

$$\left(E_x/\sqrt{E_x^2 + E_y^2 + E_z^2},\ E_y/\sqrt{E_x^2 + E_y^2 + E_z^2},\ E_z/\sqrt{E_x^2 + E_y^2 + E_z^2}\right),$$

respectively.

4. The method of claim 1, wherein the field probe comprises six orthogonally-directed sensors and a measurement is made by each sensor for each set of angles ($\theta$, $\phi$).

5. The method of claim 1, wherein the field probe has a plurality of sensors and measuring the field by the field probe includes measuring by each sensor a field value that is mapped to three orthogonal directions.

6. An apparatus configured to calibrate and store measurements and correction factors, the apparatus comprising processing circuitry configured to:
during a calibration procedure, for each of a plurality of positions of the field probe relative to a source, each position denoted by a set of angles ($\theta$, $\phi$):
obtain a measurement by each sensor;
compute a correction factor, k($\theta$, $\phi$) based on the measurements, the correction factor being given by:

$$k(\theta, \phi) = \frac{E_{inc}}{\sqrt{E_x(\theta, \phi)^2 + E_y(\theta, \phi)^2 + E_z(\theta, \phi)^2}}$$

where Ex, Ey and Ez are the fields measured by the three sensors as expressed in an x-y-z coordinate system, respectively, and $E_{inc}$ is a magnitude of an applied known field; and store the measurements of the sensors, the set of angles corresponding to the measurements and the correction factor $k(\theta, \phi)$.

7. The apparatus of claim 6, wherein the field measurements $Ex(\theta, \phi)$, $Ey(\theta, \phi)$ and $Ez(\theta, \phi)$ are normalized according to:

$$\left(E_x/\sqrt{E_x^2 + E_y^2 + E_z^2},\ E_y/\sqrt{E_x^2 + E_y^2 + E_z^2},\ E_z/\sqrt{E_x^2 + E_y^2 + E_z^2}\right),$$

respectively.

* * * * *